(12) United States Patent
Kobayashi

(10) Patent No.: US 6,330,167 B1
(45) Date of Patent: Dec. 11, 2001

(54) ELECTRONIC ASSEMBLY WITH AN ELECTROMAGNETIC RADIATION SHIELDING CAP

(75) Inventor: Hisashi W. Kobayashi, Seattle, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/316,627

(22) Filed: May 21, 1999

(51) Int. Cl.$^7$ ........................................ H05K 9/00
(52) U.S. Cl. ............... 361/818; 361/796; 361/799; 361/800; 361/801; 361/816; 361/704; 361/707; 361/715; 361/710; 361/720; 174/35 GC; 174/35 R
(58) Field of Search ..................... 361/796, 799, 361/800, 814, 816, 818, 212, 220, 704, 705, 707, 715, 710, 717–720; 174/51, 61.3, 35 R, 35 GC

(56) References Cited

U.S. PATENT DOCUMENTS

| | | | |
|---|---|---|---|
| 4,642,735 | * 2/1987 | Hodson et al. | 174/35 R |
| 4,717,990 | * 1/1988 | Tugcu | 174/35 R |
| 4,857,668 | * 8/1989 | Buonanno | 174/35 GC |
| 6,043,983 | * 3/2000 | Taylor et al. | 361/704 |

* cited by examiner

Primary Examiner—Jeffrey Gaffin
Assistant Examiner—Phuong T. Vu
(74) Attorney, Agent, or Firm—Blakely, Sokoloff, Taylor & Zafman LLP

(57) ABSTRACT

According to the invention, an electromagnetic radiation shielding cap is located over an electronic cartridge substrate. The electromagnetic radiation shielding cap includes an electromagnetic radiation shielding plate and an electromagnetic radiation shielding rim extending around a periphery of the electronic cartridge substrate. An edge of the electromagnetic radiation shielding rim contacts a thermally and electrically conductive heat plate located on an opposing side of the electronic cartridge substrate. The heat plate and the electromagnetic radiation shielding cap jointly define an electromagnetic radiation shielding enclosure around the electronic cartridge substrate.

8 Claims, 7 Drawing Sheets

ELECTRONIC ASSEMBLY WITH AN ELECTROMAGNETIC RADIATION SHIELDING CAP

BACKGROUND OF THE INVENTION

1). Field of the Invention

This invention relates to an electronic cartridge.

2). Discussion of Related Art

A computer often includes a motherboard having a connector mounted thereto, and a daughtercard which is connected to the connector on the motherboard. The card usually includes an electronic substrate and a semiconductor package mounted to the electronic substrate. The semiconductor package typically includes a semiconductor package substrate and a die mounted thereto. The semiconductor package substrate is then mounted to the electronic substrate.

A semiconductor die generates heat when powered up. A thermally conducted heat plate is mounted next to the die and is thermally coupled thereto, often utilizing a thermally conductive grease. A heat sink may be mounted to the heat plate. Heat is conducted from the electronic die to the heat plate, and from the heat plate to the heat sink and convected into the ambient.

Alternating currents within the semiconductor die, and the card generally, result in electromagnetic radiation therefrom. Electromagnetic radiation is problematic since it may interfere with components of the computer located in the vicinity of the card, causing electromagnetic interference (EMI). Certain governmental bodies often also restrict transmission of electromagnetic radiation for purposes of regulating EMI.

SUMMARY OF THE INVENTION

The invention provides an electronic cartridge comprising an electronic cartridge substrate, a first die, a thermally and electrically conductive heat plate, and an electromagnetic radiation shielding cap. The electronic cartridge substrate has first and second opposed sides. The first die is coupled to the electronic cartridge substrate. The heat plate is located adjacent the first side of the electronic cartridge substrate. The electromagnetic radiation shielding cap includes an electromagnetic radiation shielding plate on the second side of the electronic cartridge substrate. The electromagnetic radiation shielding cap also includes at least one member extending from the electromagnetic radiation shielding plate around a periphery of the electronic cartridge substrate. The member has an edge which is deflected and contacting the thermally conductive heat plate.

BRIEF DESCRIPTION OF THE DRAWINGS

The invention is further described by way of examples with reference to the accompanying drawings wherein:

FIG. 6a is an end view illustrating one member of the electromagnetic radiation shielding cap of FIG. 6;

DETAILED DESCRIPTION OF THE INVENTION

According to the invention, an electromagnetic radiation shielding cap is located over an electronic cartridge substrate. The electromagnetic radiation shielding cap includes an electromagnetic radiation shielding plate and an electromagnetic radiation shielding rim extending around a periphery of the electronic cartridge substrate. An edge of the electromagnetic radiation shielding rim contacts a thermally and electrically conductive heat plate located on an opposing side of the electronic cartridge substrate. The heat plate and the electromagnetic radiation shielding cap jointly define an electromagnetic radiation shielding enclosure around the electronic cartridge substrate.

Figure 1:
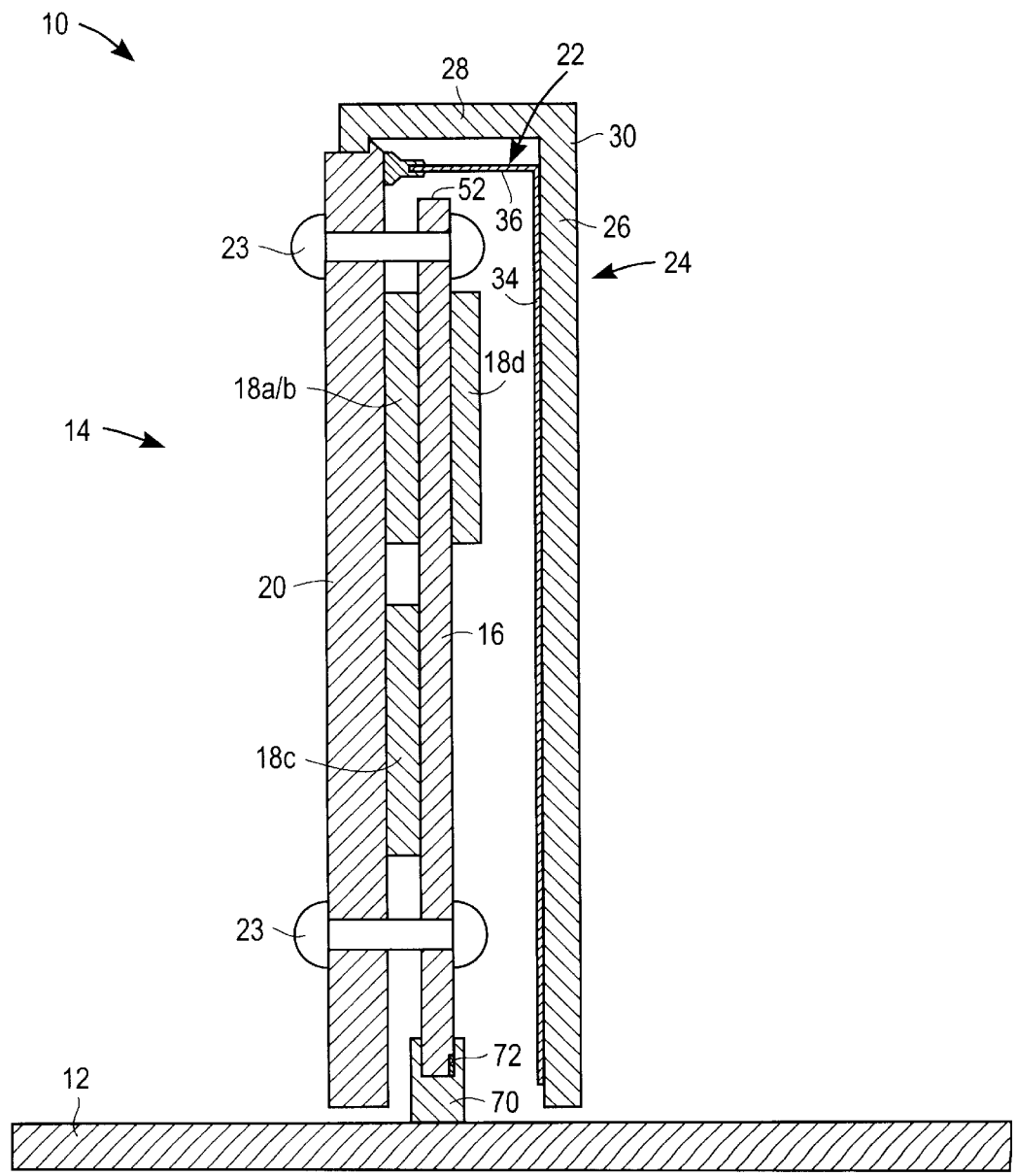
FIG. 1 is a sectioned end view of an electronic assembly according to one embodiment of the invention.

FIG. 1 of the accompanying drawings illustrates an electronic assembly 10 according to an embodiment of the invention which includes a motherboard 12 and an electronic cartridge 14. The electronic cartridge 14 includes an electronic cartridge substrate 16, a number of semiconductor packages 18, a thermally and electrically conductive heat plate 20, an electromagnetic radiation shielding cap 22, and a cover 24.

Each semiconductor package 18 includes a package substrate, and a semiconductor die which is secured to the package substrate and enclosed by a metal cap (not shown). The semiconductor die is electrically connected to the package substrate in a conventional manner utilizing solder connections, wirebonding or the like. The package substrate is then mounted to the electronics cartridge substrate 16 in a conventional manner utilizing a ball grid array or the like. A first, second, and third of the semiconductor packages 18A, 18B, and 18C are located on a primary side of the electronics cartridge substrate 16, and a fourth of the semiconductor packages 18D is located on a secondary side of the electronics cartridge substrate 16 opposing the primary side. The electronics cartridge substrate 16 is typically a printed circuit board with traces formed thereon for routing signals to and from the semiconductor packages 18.

The heat plate 20 may be made of a relatively light metal having relatively good thermal and electrical conductive characteristics, such as aluminum. The heat plate 20 is located on a side of the semiconductor packages 18A, 18B, and 18C opposing the semiconductor cartridge substrate 16. A thermally conductive grease (not shown) may be located between the heat plate 20 and the semiconductor packages 18A, 18B, and 18C so that the semiconductor packages 18A, 18B, and 18C are thermally coupled to the heat plate 20. Fasteners 23 may be inserted through openings in the thermally conductive heat plate 20 and the electronics cartridge substrate 16 so as to secure the thermally conductive heat plate 20 to the electronics cartridge substrate 16.

The cover 24 is typically made of a plastics material and includes a protective portion 26 and a protective rim 28 extending from an edge of the protective portion 26. Although not shown in FIG. 1, the protective portion 26 is substantially rectangular and the protective rim includes three respective sides. A first of the sides is shown in FIG. 1 as extending from an upper edge 30 of the protective portion. A second of the sides extends from an edge on one side of the protective portion 26, and a third of the sides extends from an edge on a side of the protective portion 26 opposing the second side.

Figure 2:
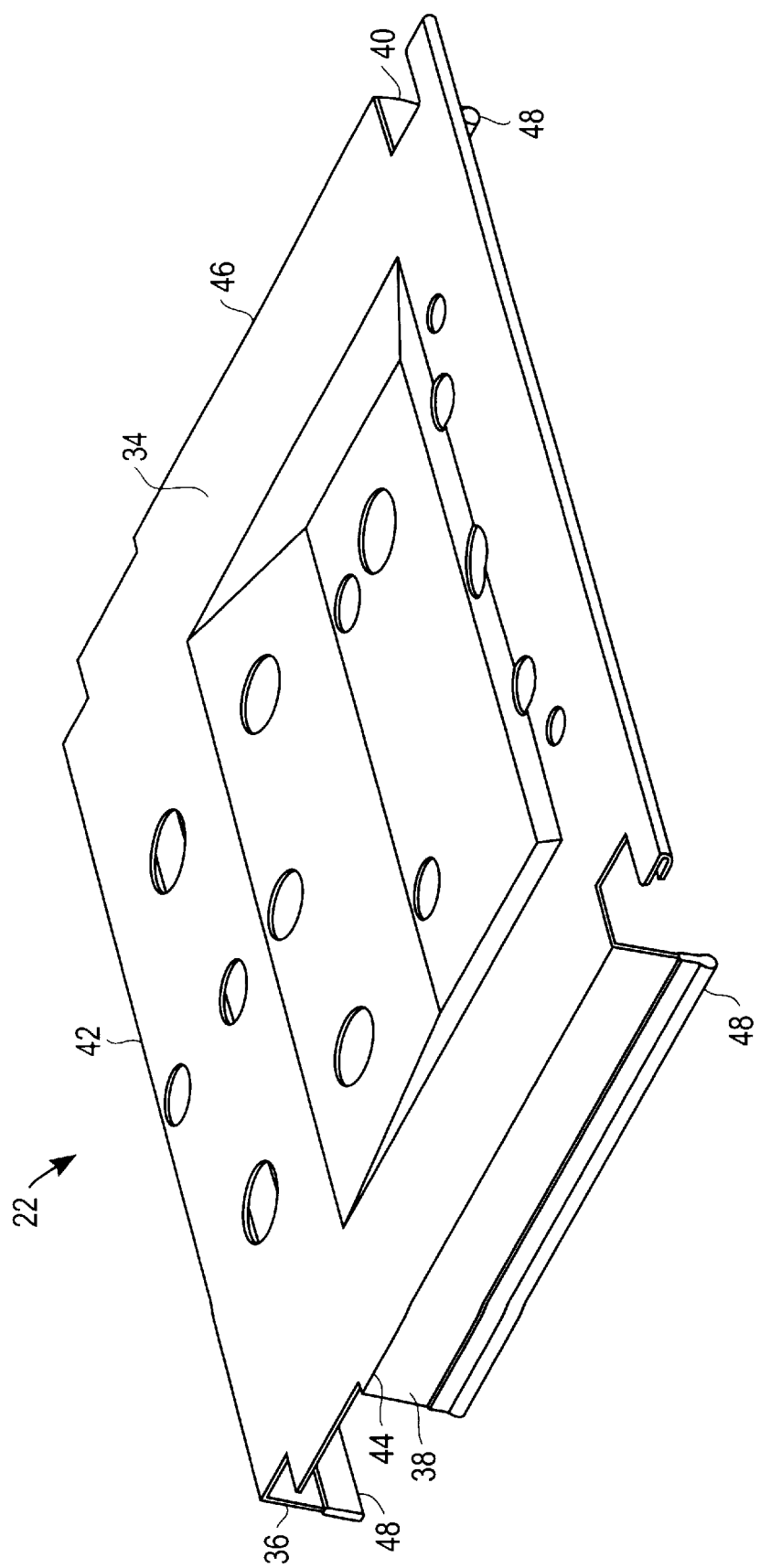
FIG. 2 is a perspective view of an electromagnetic radiation shielding cap forming part of the electronic assembly of FIG. 1.

FIG. 2 illustrates the electromagnetic radiation shielding cap 22 in more detail. The electromagnetic radiation shielding cap 22 includes an electromagnetic radiation shielding plate 34 and an electromagnetic radiation shielding rim formed by a first member 36, a second member 38, and a third member 40. The electromagnetic radiation shielding cap 22 may be formed from a sheet metal plate of a material such as stainless steel which is cut to required dimensions. The members 36,38, and 40 are then bent so as to extend transversely away from the electromagnetic radiation shielding plate 34. The first member 36 extends from an upper edge 42 of the electromagnetic radiation shielding plate 34. The second member 38 extends from one side edge 44 of the electromagnetic radiation shielding plate, and the third member 40 extends from another side edge 46 of the electromagnetic radiation shielding plate 34 opposing the second member 38.

A respective elastomer strip 48 may be attached to each of the edges of the sheet metal rim. Each elastomer strip 48 forms an edge of a respective one of the first member 36, the second member 38, and the third member 40. The elastomer strips 48 are made of a compliant, conductive, electromagnetic radiation shielding material such as a material sold under the name CHO-PLY by Chomerics, a division of Parker Hannifan Corporation of Irvine, Calif.

Referring again to FIG. 1, the electromagnetic radiation shielding cap 22 is initially positioned over the electronics cartridge substrate 16 with the electromagnetic radiation shielding plate 34 on the secondary side of the electronic cartridge substrate 16. The electromagnetic radiation shielding rim formed by the first member 36 and the second and third members (not shown) extends around a periphery 52 of the electronics cartridge substrate 16. The first member 36 extends around an upper periphery of the electronics cartridge substrate 16. The second and third members 38 and 40 extend around opposing peripheries on sides of the electronics cartridge substrate 16. The cover 24 is then positioned over the electromagnetic radiation shielding cap 22.

Figure 3:
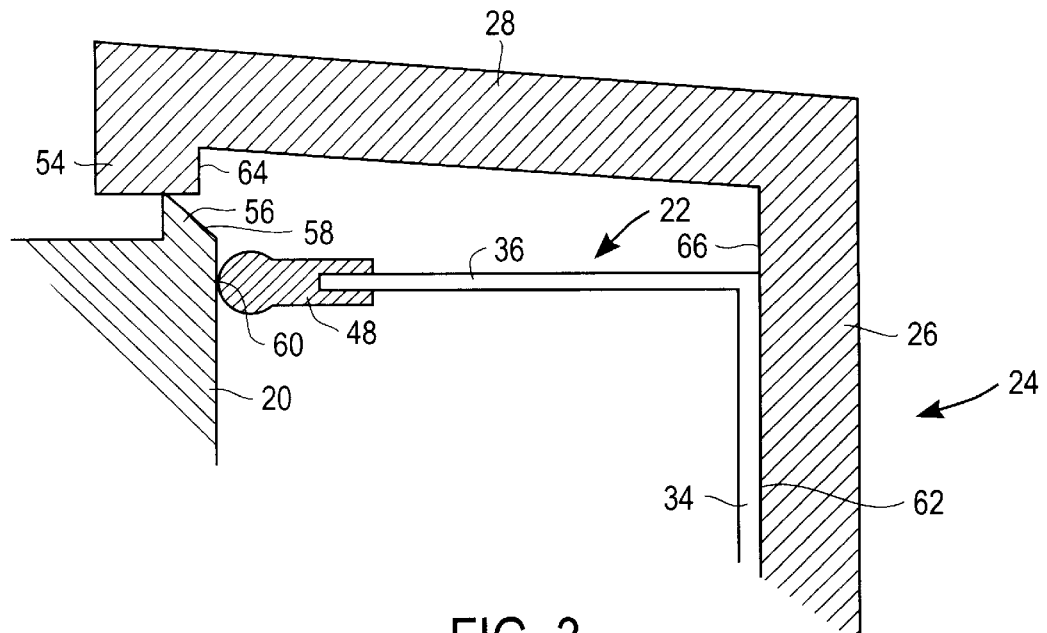
FIG. 3 is a sectioned end view of a portion of an electronic cartridge forming part of the electronic assembly of FIG. 1, before being finally assembled.

FIG. 3 illustrates the heat plate 20, the electromagnetic radiation shielding cap 22, and the cover 24 in more detail, before final assembly.

The cover 24 includes a lip 54 which extends inwardly from an edge of the protective rim 28. The heat plate 20 includes a projection 56 having a slanted surface 58 on a side thereof facing the cover 24. The cover 24 is initially positioned so that the lip 54 is located against the sloped surface 58 and then pushed towards the heat plate 20. The lip 54 slides along the sloped surface 58 causing the protective rim 28 to bend relative to the protective portion 26. The lip 54 then moves over the projection 56.

The electromagnetic radiation shielding cap 22 is attached to the cover 24 by means of formations on the cover 24 which inter-engage with formations on the electromagnetic radiation shielding cap 22. An edge 60 of the first member 36 defined by the elastomer strip 48 is spaced from an outer surface 62 of the electromagnetic radiation shielding plate 34 by a distance which is slightly larger than a distance from the heat plate 20 to an inner surface 66 of the protective portion 26. The elastomer strip 48 thus contacts the heat plate 20, and the electromagnetic radiation shielding plate 34 contacts the protective portion 26 before the lip 54 moves entirely over the projection 56.

Figure 4:
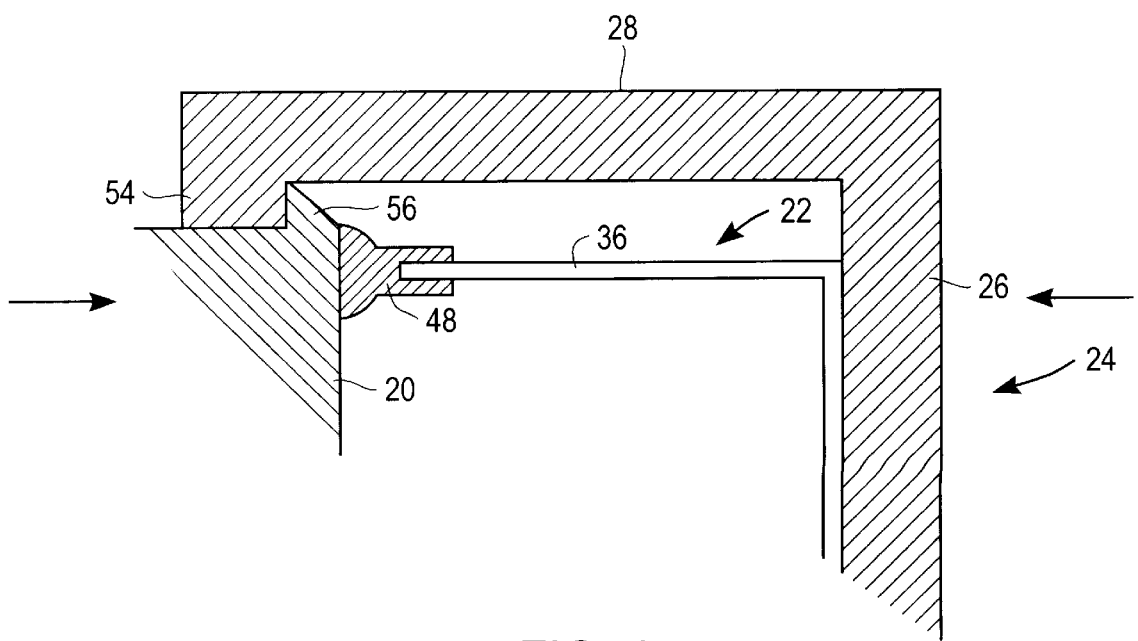
FIG. 4 is a view similar to FIG. 3 after final assembly of the electronic cartridge.

Further movement of the cover 24 towards the thermally conductive heat plate 20 causes compression of the elastomer strip 48 by the heat plate 20 as shown in FIG. 4. The lip 54 then snaps into position behind the projection 56. The cover 24 is thereby secured to the thermally conductive heat plate 20 with the elastomer strip 48 clamped between the heat plate 20 and the cover 24. Proper contact between the elastomer strip 48 and the thermally conductive plate 20 is so ensured. The heat plate 20 and the electromagnetic radiation shielding cap 22 provide a Faraday cage around the electronic cartridge substrate 16 and the semiconductor packages 18.

The electronic cartridge 14 as finally assembled is then connected to the motherboard 12. The motherboard 12 may be a printed circuit board having a grounding layer therein or thereon. A first connector 70 is pre-mounted on the motherboard 12. Conductive edge fingers 72 are formed on a lower periphery of the electronics cartridge substrate 16, thus providing a second connector. The lower periphery of the electronics cartridge substrate 16 having the edge fingers 72 is then inserted into the first connector 70 so that the electronic cartridge 14 is located in a stationary position relative to the motherboard 12. Another device such as a grounding skirt (not shown) may be used to connect the Faraday cage consisting of the conductive heat plate 20 and the electromagnetic radiation shielding cap 22 to the grounding layer of the motherboard 12.

In use, the semiconductor packages 18 are connected to the motherboard 12 through the electronic cartridge substrate 16. During operation heat is generated by the dies of the semiconductor packages 18. The heat is transferred to the heat plate 20. A heat sink (not shown) may be mounted on the heat plate 20 to conduct and convect the heat away from the heat plate 20.

In addition, alternating currents within various electrical components, including the semiconductor packages 18 emit electromagnetic radiation. The heat plate 20 attenuates the electromagnetic radiation on the primary side of the electronics cartridge substrate 16. The electromagnetic radiation shielding plate 34 attenuates electromagnetic radiation from the secondary side of the electronics cartridge substrate. The electromagnetic radiation shielding rim formed by the first, second, and third members 36, 38, and 40 also attenuates radiation emanating from between the heat plate 20 and the electromagnetic radiation shielding plate 34. Because of proper, continuous contact between the elastomer strip 48 and the heat plate 20 there is little or no leakage of electromagnetic radiation between the electromagnetic radiation shielding rim and the heat plate 20. Any alternating currents generated within the electromagnetic radiation shielding cap 24 can be conducted to the heat plate 20 because of a closed circuit provided by the elastomeric strip 48. Any alternating currents created on the heat plate 20 and the electromagnetic radiation shielding cap 22 may be conducted via the grounding skirt to the grounding layer in the motherboard 12.

Figure 5:
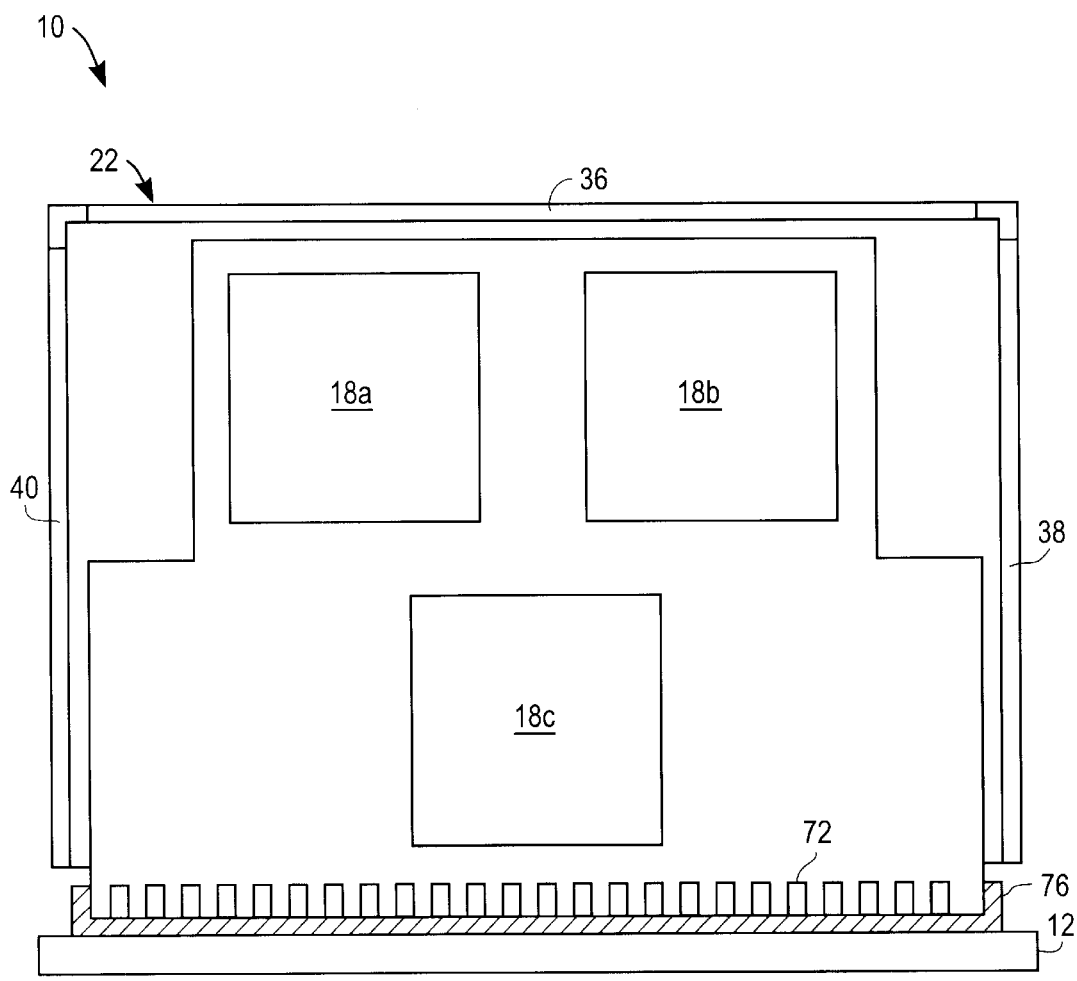
FIG. 5 is a front view illustrating some of the components of the electronic assembly of FIG. 1.

FIG. 5 illustrates components of the electronic assembly 10 in front view. It can be seen that the first member 36 is located above the electronics cartridge substrate 16. The second member 38 is located on one side of the electronics cartridge substrate, and the third member 40 is located on a side of the electronics cartridge substrate 16 opposing the second member 38. Electromagnetic radiation emanating in upwardly and sideways directions can thus be attenuated by the electromagnetic radiation shielding cap 22.

Figure 6:
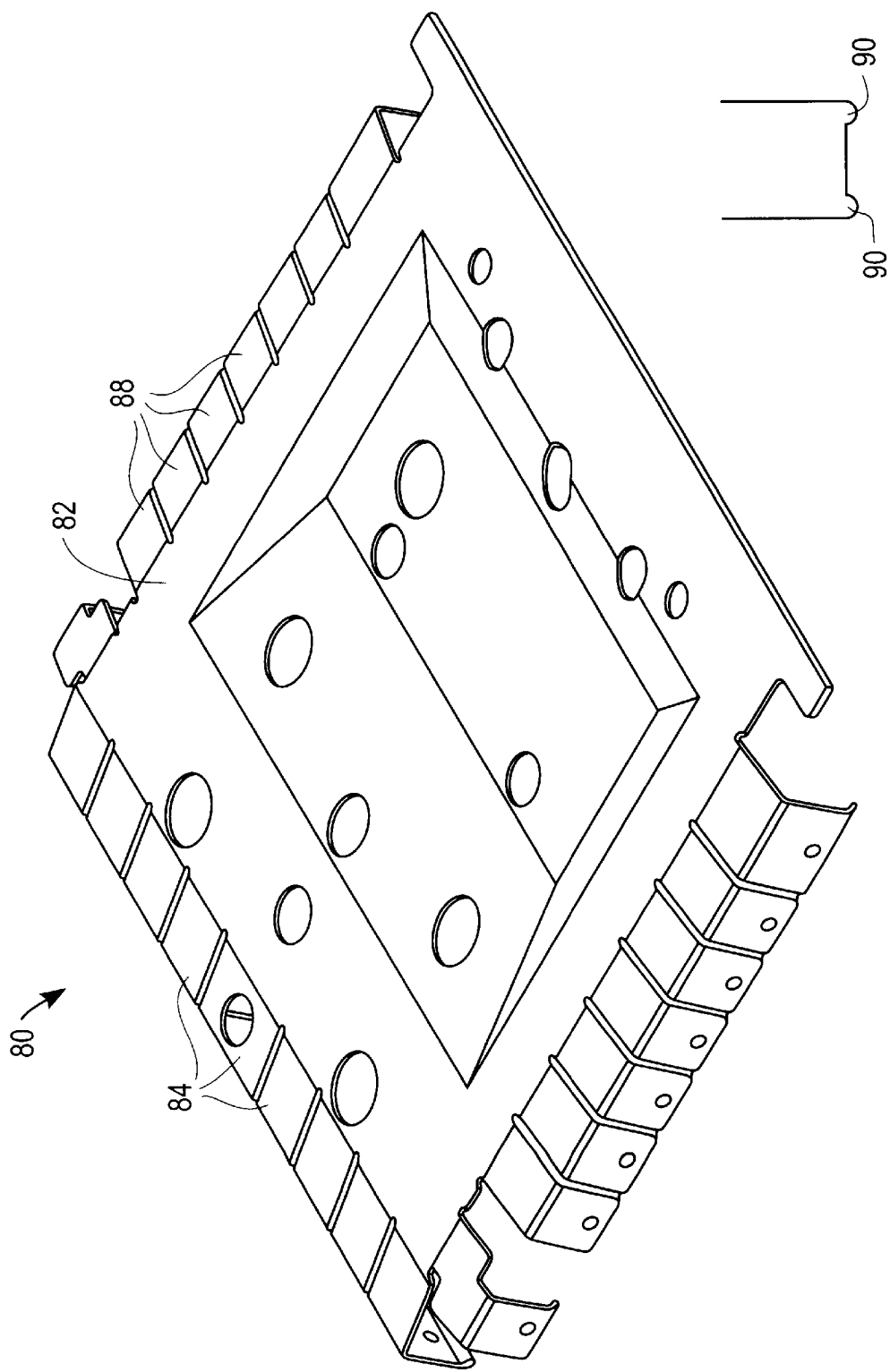
FIG. 6 is a perspective view of an electromagnetic radiation shielding cap which may be used in another embodiment of an electronic assembly according to the invention.

FIG. 6 illustrates an electromagnetic radiation shielding cap 80 that can be used in another embodiment according to the invention. The electromagnetic radiation shielding cap 80 includes an electromagnetic radiation shielding plate 82, a first set of springable members 84, a second set of springable members 86, and a third set of springable members 88. The electromagnetic radiation shielding plate 82 and the springable members 84, 86, and 88 may be formed by cutting a sheet metal plate to required dimensions and then bending the sheet metal plate to form the shapes of the springable members 84, 86, and 88 which extend transversely from the electromagnetic radiation shielding plate 82.

The first set of springable members 84 are located along an upper periphery of the electromagnetic radiation shielding plate 82. The second set of springable members 86 are located along a periphery on one side of the radiation shielding plate, and the third set of springable members 88 are located on a periphery of the electromagnetic radiation shielding plate 82 opposing the second set of springable members 86. The springable members 84, 86, and 88 form an electromagnetic radiation shielding rim extending from three sides of the electromagnetic radiation shielding plate 82. As shown in FIG. 6a, each springable member 84, 86, or 88 may have two projections 90 on opposing sides to prevent loss of contact.

Figure 7:
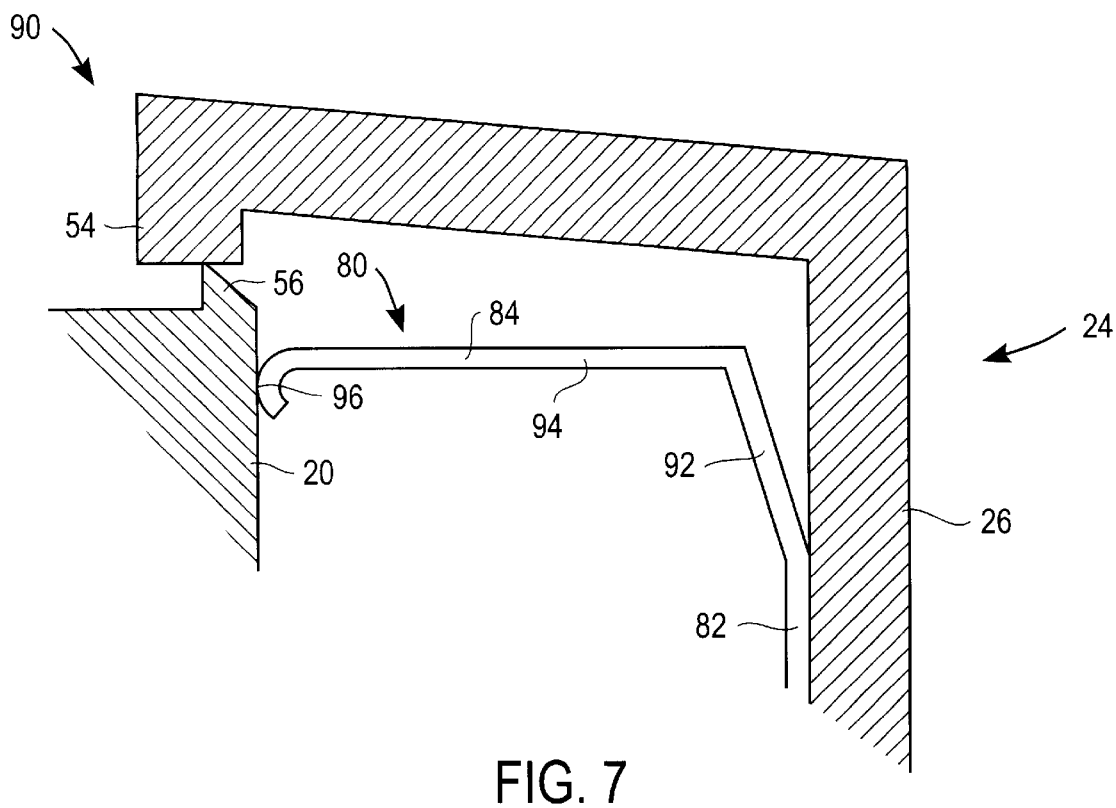
FIG. 7 is a sectioned end view which illustrates a portion of an electronic cartridge of an electronic assembly which utilizes the electromagnetic radiation shielding cap of FIG. 6, before final assembly.

FIG. 7 illustrates a portion of an electronic assembly 90 when the electromagnetic radiation shielding cap 80 is used. The electronic assembly 90 includes a heat plate 20 and a cover 24 as the embodiment of FIG. 1. For purposes of illustration, only one of the springable members 84 of the first set of springable members is shown.

The springable member 84 includes a first portion 92 which extends from the electromagnetic radiation shielding plate 82 and is bent slightly away from the protective portion 26. A few degrees of play is therefore provided between the first portion 92 and the protective portion 26 when the electromagnetic radiation shielding plate 82 is located against the protective portion 26. A second portion 94 of the member 84 extends from the first portion 92 towards the thermally conductive plate 20 and an edge 96 of the second portion 94 contacts the thermally conductive plate 20.

Figure 8:
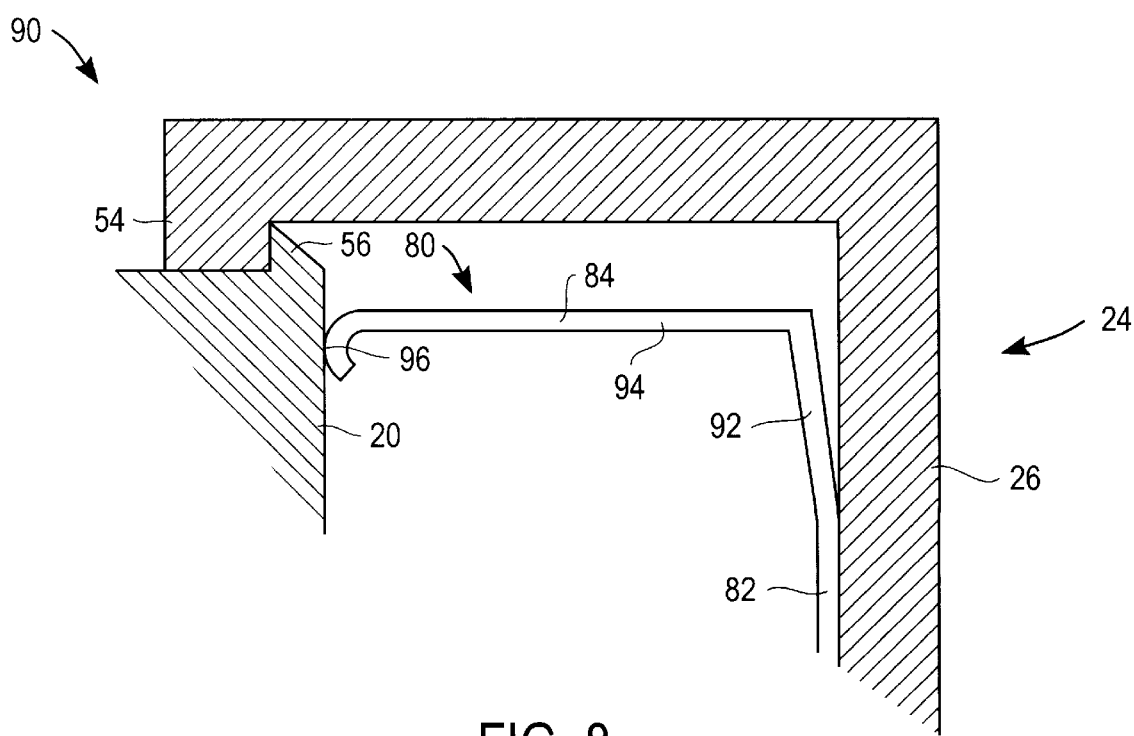
FIG. 8 is a view similar to FIG. 7 after final assembly of the electronic cartridge of the electronic assembly of FIG. 7.

The cover 24 is then pushed towards the heat plate 20 as shown in FIG. 8 to secure the cover 24 to the heat plate 20 as discussed with reference to FIG. 4. Because of the dimensions of the first member 84, the first portion 92 bends under spring action towards the protective portion 26. A spring force created within the first portion 92 ensures that the edge 96 properly contacts the heat plate 20.

It should be noted that each springable member 84, 86, or 88 is independently movable from the other. Differences in height over the heat plate 20 or other irregularities such as tolerances in the manufacture of the electromagnetic radiation shielding cap 80, or the exact positioning of the protective portion 26 relative to the heat plate 20 can be compensated for because of individual movement of each springable member 84, 86, or 88. Two of the springable members 84, 86, 88 may thus "settle" at different heights, thus allowing for proper, continuous contact of the entire electromagnetic radiation shielding rim with the heat plate 20. A grounding skirt (not shown) may again be needed for grounding the heat plate 20 and electromagnetic radiation shielding cap 80 with a motherboard.

Figure 9:
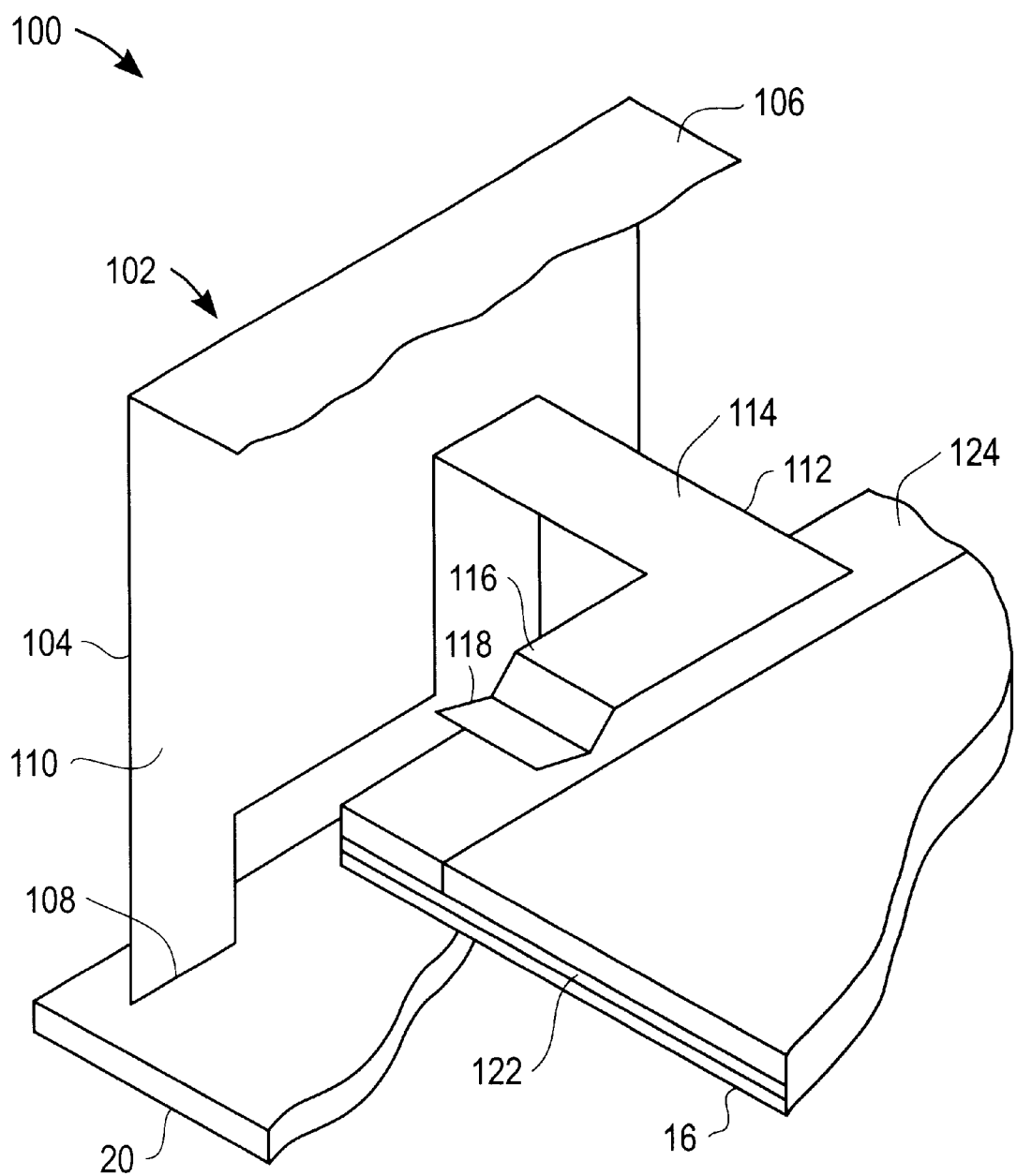
FIG. 9 is a perspective view illustrating a portion of an electronic assembly according to a further embodiment of the invention.

FIG. 9 illustrates a portion of an electronic assembly 100 according to another embodiment of the invention. The electronic assembly 100 is the same as the electronic assembly 10 of FIG. 1 except that another electromagnetic radiation shielding cap 102 is used.

The electromagnetic radiation shielding cap 102 includes a plurality of springable members 104. The springable members 104 are arranged around an electromagnetic radiation shielding plate (not shown) of the electromagnetic radiation shielding cap 102 in a manner which is similar to the manner in which the springable members 84, 86 and 88 are arranged as illustrated in FIG. 6. Each springable member 104 also includes a first portion 106 which bends under spring action to create a force which ensures that an edge 108 of a second portion 110 thereof properly contacts the heat plate 20 of the electronic assembly 100. In addition, an L-shaped contact member 112 is cut and bent out of the second portion 110. The L-shaped member 112 includes a first leg 114 extending from the second portion 110, and a second leg 116 extending transversely from the first leg 114. A tip of the second leg 116 is bent to form a contact portion 118.

The electronic cartridge substrate 16 includes a conventional metal grounding layer 122. In addition, a metal grounding strip 124 is formed along a pheriphery of the electronics cartridge substrate. The grounding strip 124 contacts the grounding layer 122.

The contact element is formed so that the contact portion 118 contacts the metal grounding strip 124. When the electronic assembly 100 is finally assembled, currents can be drained from the electromagnetic radiation shielding cap 102 to the contact element 112 and from the contact element 112 to the metal grounding strip 124 and to the grounding layer 122.

Referring again to FIG. 1, the grounding layer may be electrically connected to the edge fingers 72. The edge fingers 72 may in turn be electrically connected through grounding pins of the first connectors 70 to the grounding layer of the motherboard 12 so that the motherboard 12 can be used for grounding the electromagnetic radiation shielding cap 102 of FIG. 9.

The embodiment of FIG. 1 has superior electromagnetic radiation shielding characteristics because of the use of the elastomeric strips 48. The FIG. 6 embodiment may be more manufacturable and less expensive than the other embodiments. The FIG. 9 embodiment has the advantage that no grounding skirt is required.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed:
1. An electronic cartridge comprising:
an electronic cartridge substrate;
a plurality of edge finger connectors on a first periphery of the electronic cartridge substrate;
at least a first die mounted to the electronic cartridge substrate;
a thermally and electrically conductive heat plate secured to the electronic cartridge substrate on a side of the die opposing the electronic cartridge substrate and being thermally coupled to the first die;

an electromagnetic radiation shielding cap including an electromagnetic radiation shielding plate on a side of the electronic cartridge substrate opposing the first die, and an electromagnetic radiation shielding rim formed by members extending from the electromagnetic radiation shielding plate around a second, third, and fourth peripheries of the electronic cartridge substrate, each member having an edge contacting the thermally and electrically conductive heat plate; and a cover over the electromagnetic radiation shielding cap, the cover including a protective portion next to the electromagnetic radiation shielding plate and a protective rim next to the electromagnetic radiation shielding rim, the cover being secured to the heat plate in a position wherein the cap is clamped between the thermally and electrically conductive heat plate and the protective portion so that the edges of the members are deflected towards the radiation shielding plate, an opening being defined over the first periphery of the electronics cartridge substrate.

2. An electronic cartridge according to claim 1, wherein the edge of the electromagnetic radiation shielding cap includes an electrically conductive elastomer which is deflected by the heat plate.

3. An electronic cartridge according to claim 1, wherein the member is deflected due to bending thereof.

4. An electronic cartridge according to claim 1, which includes a first set of said members extending around a periphery on the first side of the electronic cartridge substrate, wherein one of the members of the first set of members can be independently deflected from another one of the members of the first set of members.

5. An electronic cartridge according to claim 4, which includes a second set of said members extending around a periphery on a second side of the electronic cartridge substrate, wherein one of the members of the second set of members is independently deflected from another one of the members of the second set of members, the members defining an electromagnetic shielding rim at least partially around the electronic cartridge substrate.

6. An electronic cartridge according to claim 1, wherein the electronic cartridge substrate includes a grounding layer and the electromagnetic radiation shielding cap is electrically connected to the grounding layer.

7. An electronic cartridge according to claim 6, wherein the electromagnetic radiation shielding cap includes a connector element which has a contact portion contacting the substrate so as to connect the electromagnetic radiation shielding cap to the grounding layer.

8. An electronic cartridge according to claim 1, further comprising a second die mounted to the electronic cartridge substrate on a side of the electronic cartridge substrate opposing the first die.

\* \* \* \* \*